(12) United States Patent
Grivna

(10) Patent No.: US 7,397,070 B2
(45) Date of Patent: Jul. 8, 2008

(54) SELF-ALIGNED TRANSISTOR

(75) Inventor: Gordon M. Grivna, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 11/864,327

(22) Filed: Sep. 28, 2007

(65) Prior Publication Data

US 2008/0017951 A1 Jan. 24, 2008

Related U.S. Application Data

(62) Division of application No. 11/238,868, filed on Sep. 30, 2005, now Pat. No. 7,300,850.

(51) Int. Cl.
*H01L 29/739* (2006.01)
*H01L 21/331* (2006.01)

(52) U.S. Cl. ............... 257/197; 257/526; 257/E29.242; 438/348; 438/366; 438/446

(58) Field of Classification Search ............ None
See application file for complete search history.

(56) References Cited

U.S. PATENT DOCUMENTS 5,198,372 A * 3/1993 Verret .................. 438/330
5,616,508 A * 4/1997 Johnson ................ 438/350
7,300,850 B2 * 11/2007 Grivna ................. 438/348

* cited by examiner

*Primary Examiner*—Alonzo Chambliss
(74) *Attorney, Agent, or Firm*—Robert P. Hightower

(57) ABSTRACT

In one embodiment, a transistor is formed to use two conductors to make electrical connection to one of the active regions of the transistor.

7 Claims, 4 Drawing Sheets

US 7,397,070 B2

SELF-ALIGNED TRANSISTOR

The present application is a divisional application of prior U.S. application Ser. No. 11/238,868, filed on Sep. 30, 2005, now U.S. Pat. No. 7,300,850 which is hereby incorporated by reference, and priority thereto for common subject matter is hereby claimed.

BACKGROUND OF THE INVENTION

The present invention relates, in general, to electronics, and more particularly, to methods of forming semiconductor devices and structure.

Previously, the semiconductor industry utilized various methods and structures to form high performance bipolar transistors. To achieve higher performance, it was important to minimize the size of the base contact in order to reduce parasitic capacitances. Additionally, it was desirable to be able to shrink the size of the transistors using photolithographic scaling techniques. Prior methods of forming high performance bipolar transistors typically relied on slot etching techniques which generally were difficult to control and costly from a manufacturing standpoint. One example of such a bipolar transistor is disclosed in U.S. patent publication number 2005/0012180 by inventor Freeman et al which was published on Jan. 20, 2005. The method used to form the high performance bipolar transistor etched narrow slots through a dielectric and used the narrow slots as a mask to form other portions of the transistor. These prior bipolar transistor structures also used multiple oxide or photoresist plugs to alternatively define both outside and inside edges of the emitter opening. Using plugs to define openings requires multiple processing steps and restricts the size of the openings to be plugged.

Accordingly, it is desirable to have a method of forming a bipolar transistor that can easily be scaled between large or small dimensions, that does not utilize slot processing or plug techniques, and that reduces the manufacturing costs.

For simplicity and clarity of illustration, elements in the figures are not necessarily to scale, and the same reference numbers in different figures denote the same elements. Additionally, descriptions and details of well-known steps and elements are omitted for simplicity of the description. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions may not be straight lines and the corners may not be precise angles.

DETAILED DESCRIPTION OF THE DRAWINGS

Figure 1:
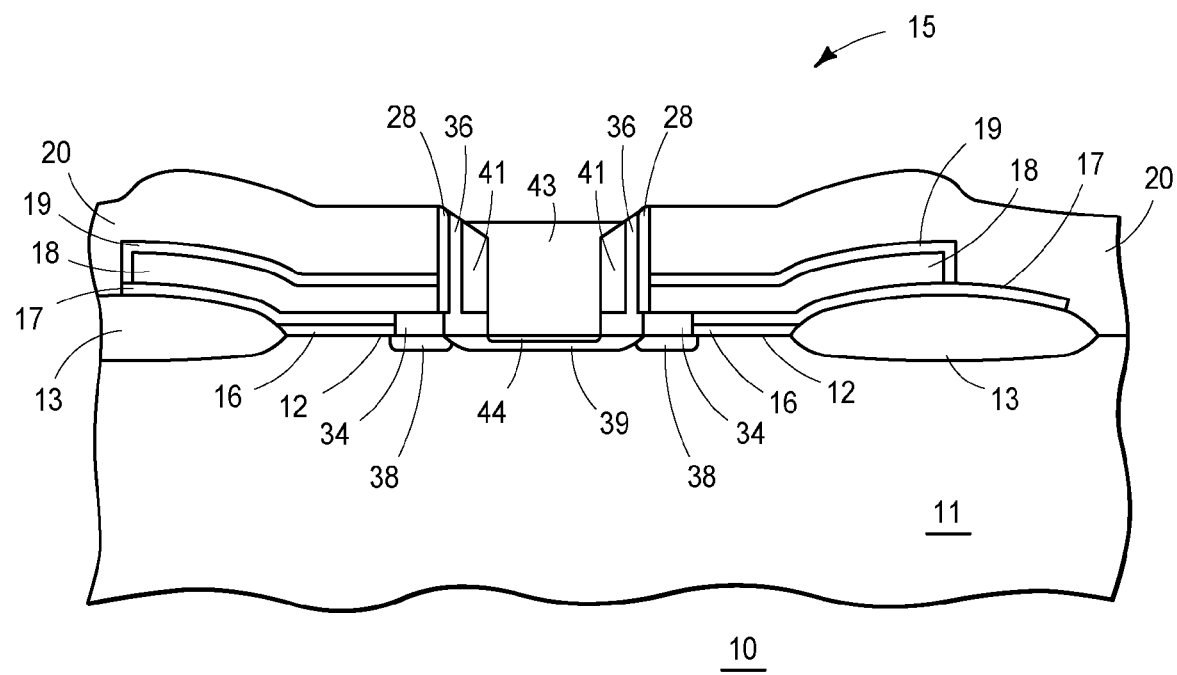
FIG. 1 illustrates an enlarged cross-sectional portion of a bipolar transistor in accordance with the present invention.

FIG. 1 illustrates an enlarged cross-sectional portion of a bipolar transistor 10. As will be seen further hereinafter, transistor 10 is scalable using photolithographic techniques to smaller or larger sizes. Transistor 10 is a bipolar transistor that has a doped region 38 and a doped region 39 that form a base of transistor 10 and a doped region 44 that forms an emitter. A conductor 18 and a conductor link 34 are formed to provide an electrical connection to the base.

Figure 2:
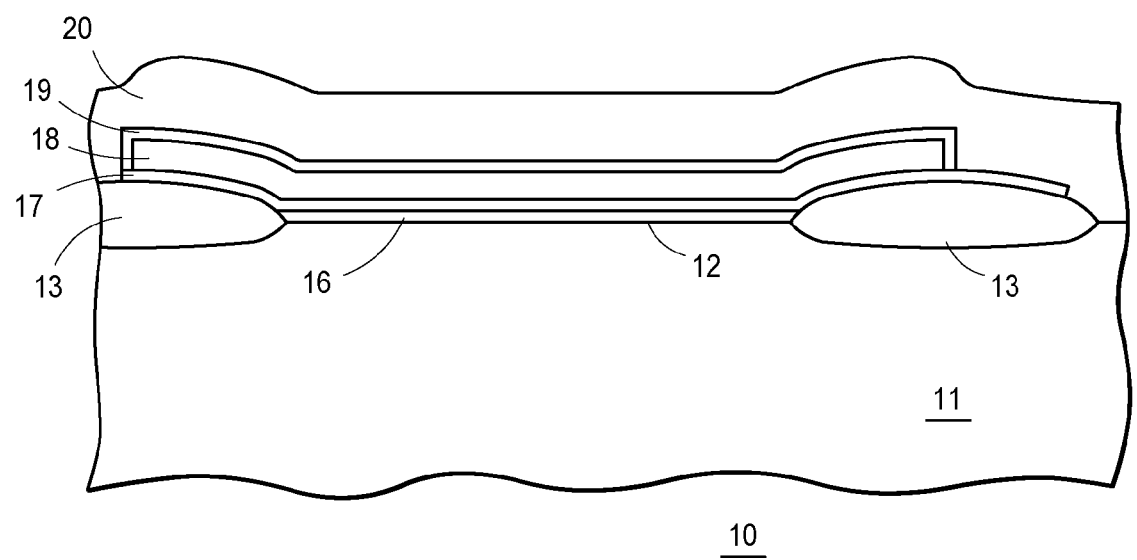
FIG. 2 through FIG. 7 illustrate enlarged cross-sectional portions of the transistor of FIG. 1 according to various stages of a method of forming the transistor of FIG. 1 in accordance with the present invention.

FIG. 2 illustrates an enlarged cross-sectional portion of transistor 10 at a stage of manufacturing according to an embodiment of a method of making transistor 10. Transistor 10 is formed on a semiconductor substrate 11 that has a top surface 12. In the preferred embodiment, transistor 10 is a PNP bipolar transistor that is formed on a semiconductor substrate 11 which includes a heavily doped P-type bulk substrate on which a lightly doped P-type epitaxial layer or possibly a lightly doped P-type tub is formed to accommodate transistor 10. These P-type elements are not illustrated because they may not exist in all embodiments. Typically, a field oxide 13 is formed on surface 12 of substrate 11 near the outer edges of transistor 10. A layer of silicon dioxide or oxide 16 is formed on a portion of surface 12 surrounded by field oxide 13. Oxide 16 generally is a thermal oxide. A first protective layer 17 is formed to cover oxide 16. A conductor 18 is formed on a portion of protective layer 17 and overlying oxide 16. Thereafter, another protective layer 19 is formed to cover conductor 18. The material used for protective layers 17 and 19 is a material that has reduced etch rate compared to the operations that are used to etch conductor 18. In the preferred embodiment, conductor 18 is doped polysilicon to form a good electrical conductor and layers 17 and 19 are silicon nitride. An interlayer dielectric 20, such as silicon dioxide or oxide, is formed on at least a portion of layer 19 and preferably overlying all of conductor 18. As will be seen further hereinafter, the thickness of oxide 16, layers 17 and 19, conductor 18, and dielectric 20 can all affect the dimensions of some elements of transistor 10.

Figure 3:
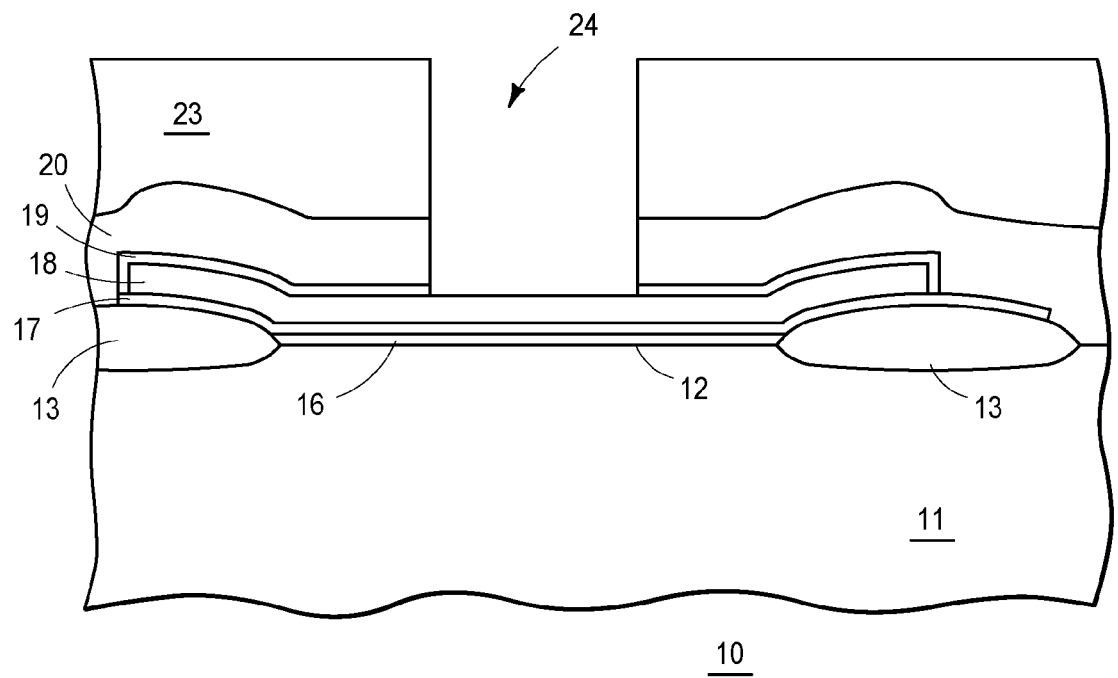

FIG. 3 illustrates an enlarged cross-sectional portion of transistor 10 at a subsequent manufacturing stage after forming dielectric 20 according to an embodiment of a method of making transistor 10. A mask 23 is applied to dielectric 20 and patterned to form an opening overlying the portion of surface 12 where the base and emitter of transistor 10 are to be formed. The exposed portion of dielectric 20 and the underlying portion of layer 19 are removed forming an opening 24 through which the active portions of transistor 10 and electrical contacts thereto will be formed. The operation used to etch through dielectric 20 also removes the portion of layer 19 within opening 24. Typically, a reactive ion etch (RIE) is used to remove the portions of dielectric 20 and layer 19. In the preferred embodiment, the polysilicon of conductor 18 is an etch stop for this operation.

Figure 4:
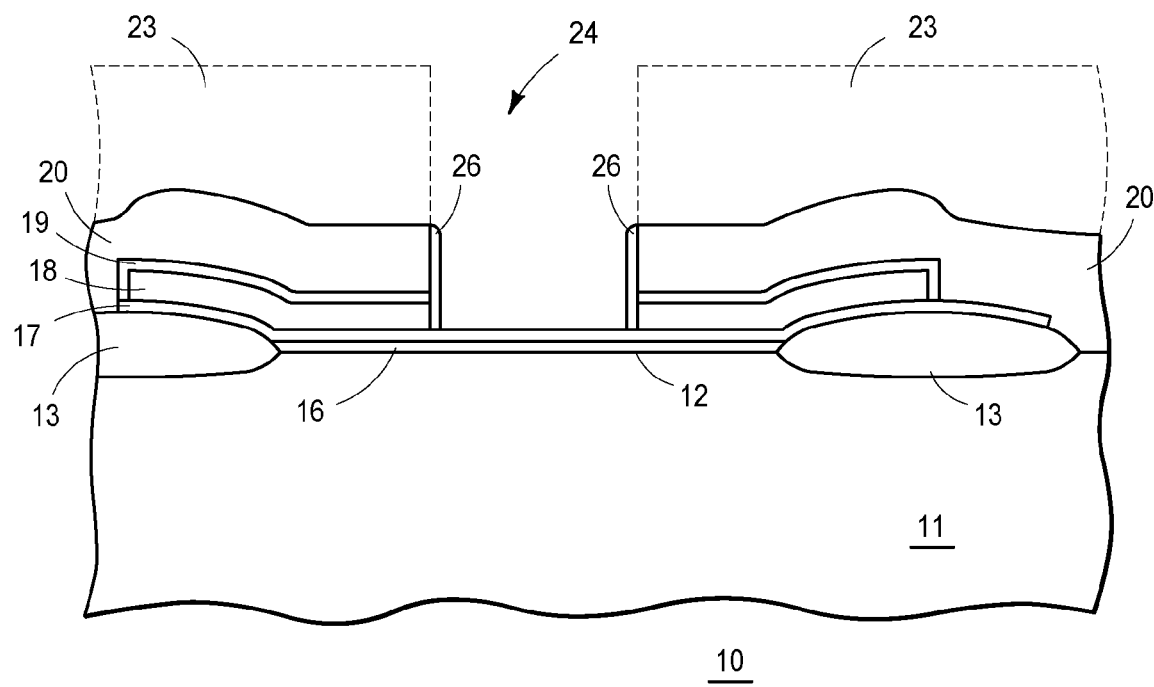

FIG. 4 illustrates transistor 10 at a subsequent stage according to an embodiment of a method of making transistor 10. The portion of conductor 18 that is exposed within opening 24 is removed. In the preferred embodiment, the process used to remove the exposed portion of the doped polysilicon of conductor 18 is selective between conductor 18 and the silicon nitride of layer 17, thus, layer 17 forms an etch stop for this operation. Thereafter, mask 23 is removed, as illustrated by the dashed lines. Opening 24 exposes sidewalls of dielectric 20, the sidewall of conductor 18, and the sidewall of layers 19 and 17. Polysilicon spacers 26 are formed along these sidewalls of dielectric 20, conductor 18, and layers 19 and 17. Spacers 26 generally are formed by a conformal blanket deposition of polysilicon that is deposited along the top of dielectric 20, and within opening 24 along the sidewalls of dielectric 20, conductor 18, and layers 19 and 17, and on the exposed surface of layer 17. Thereafter, an anisotropic etch is utilized to remove the polysilicon and leave a portion of the polysilicon as spacers 26.

Figure 5:
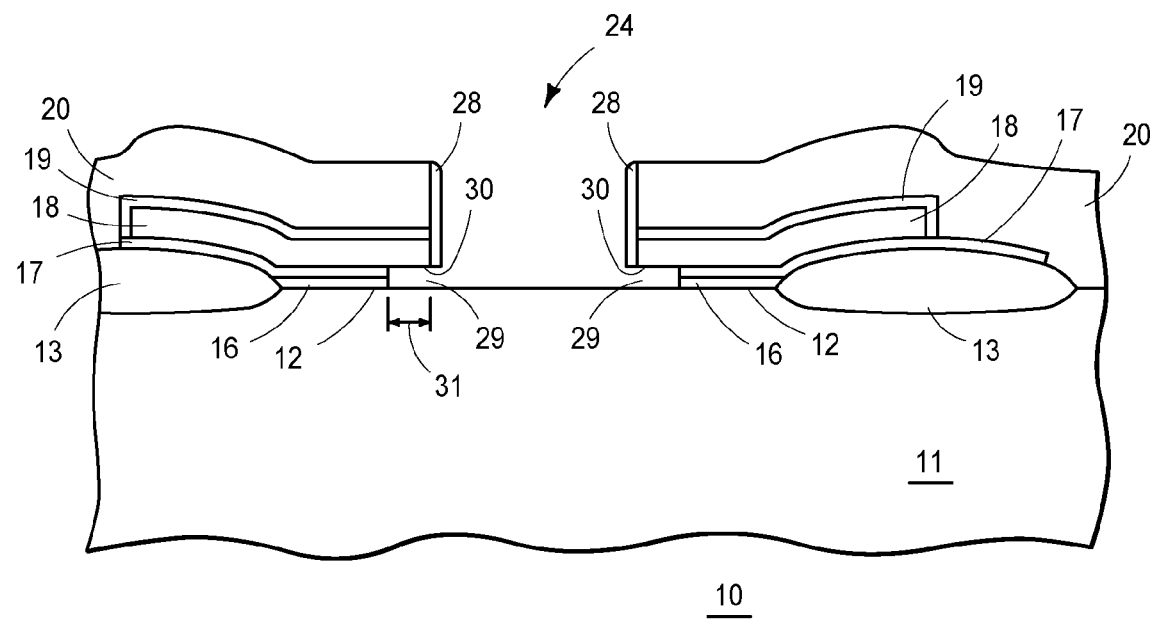

FIG. 5 illustrates transistor 10 at a subsequent stage according to an embodiment of a method of making transistor 10. Spacers 26 are oxidized to form protective spacers 28 where spacers 26 were formed. Typically, a wet oxidation is utilized to form spacers 26 into spacers 28. The width of spacers 26 (FIG. 4) and spacers 28 is very small in order to not interfere with the subsequent formation of the base and emitter of transistor 10. In the preferred embodiment, spacers 26 extend about fifty (50) nano-meters into opening 24 and resulting spacers 28 extend about sixty five (65) nano-meters into opening 24. Thereafter, layer 17 is removed from within opening 24 and from a first distance 31 underlying conductor 18. After the removal of layer 17 the exposed portion of layer 16 is removed from approximately the same areas as was layer 17. Protective spacers 28 protect the sidewalls of dielectric 20, conductor 18, and layer 19 during these operation. The removal of layer 17 and 16 undercuts conductor 18 to form a recess 29 underlying conductor 18 that expose a ledge of conductor 18 having a bottom surface 30. In the preferred embodiment, the portion of layer 17 is removed by a wet nitride etch in phosphoric acid for approximately sixty (60) minutes is utilized to form distance 31 to approximately ten (10) nanometers. In this preferred embodiment, the portion of oxide 16 is removed with an HF based wet etch that etches oxide and is selective to layer 17 and conductor 18. The removal of layer 16 also removes a similar amount from spacers 28 which makes spacers 28 thinner but leaves the sidewalls substantially vertical relative to surface 12. As will be seen further hereinafter, distance 31 is important and assists in minimizing the width of the extrinsic or inactive base of transistor 10.

Figure 6:
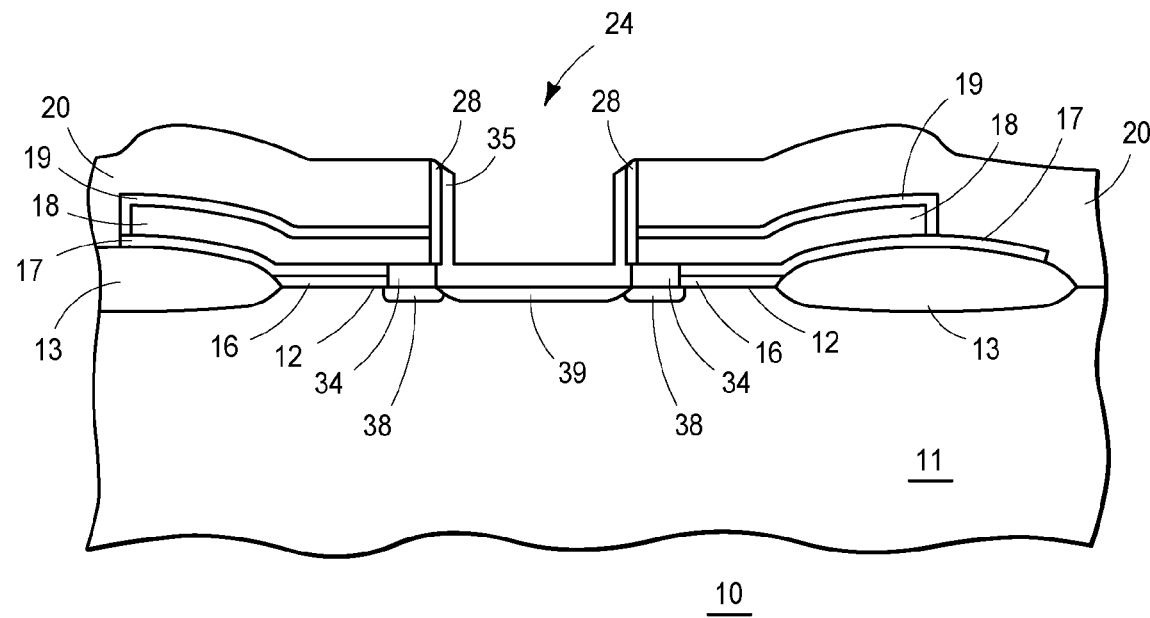

FIG. 6 illustrates a further stage according to an embodiment of a method of making transistor 10. A conductor link 34 is formed in recess 29 and utilized to interconnect conductor 18 to the inactive base that is subsequently to be formed as doped region 38. Link 34 generally is formed by applying a conformal layer of doped polysilicon on dielectric 20, spacers 28, into recess 29, and along the portions of surface 12 that are exposed within opening 24. The conformal polysilicon is deposited to a thickness no less than one-half the depth of recess 29. An anisotropic etch is used to remove the polysilicon but leave a portion of the polysilicon as link 34 filling recess 29 and underlying both conductor 18 and spacer 28. Preferably, the conformal layer of polysilicon is formed to a thickness of approximately fifty (50) nanometers. Thereafter, transistor 10 is oxidized through opening 24 to form a silicon dioxide layer or oxide layer 35 along the sidewalls of spacers 28, the sidewalls of link 34, and the exposed portion of surface 12. Preferably, oxide layer 35 is formed to a thickness of approximately seventy (70) nanometers. In the preferred embodiment, a thermal oxidation cycle is used which also drives dopants from conductor 18 into link 34 and into substrate 11 to form an extrinsic portion of the base of transistor 10 as a doped region 34 on first surface 12. This ensures a very low resistance electrical connection is made between link 34 and region 38.

The active base region of the device is formed by doping a portion of surface 12 through opening 24 to form doped region 39 on surface 12. Preferably, region 39 is formed by implanting dopants through oxide layer 35 into substrate 11. In the preferred embodiment, a boron implant of approximately 2.5E13 at an energy of 30 KeV is used.

Figure 7:
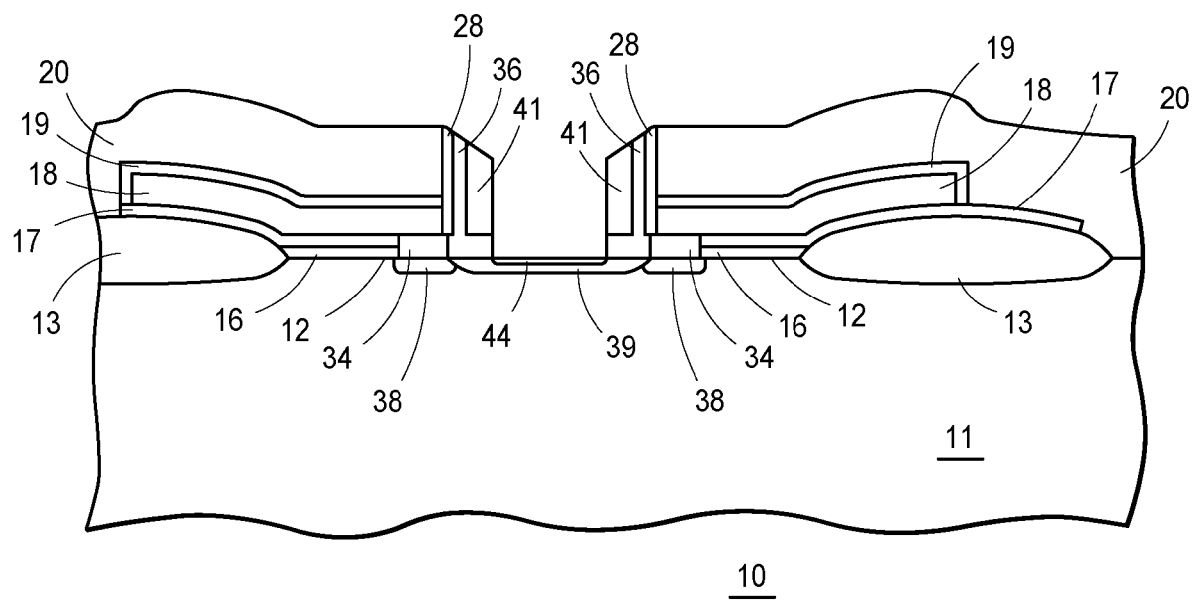

FIG. 7 illustrates another subsequent stage according to an embodiment of a method of making transistor 10. In the preferred embodiment undoped polysilicon of about three hundred (300) nanometers is deposited within opening 24 followed by an anisotropic etch that leaves polysilicon fillers 41 along the sidewalls of layer 35 and extending along a portion of the bottom of layer 35. Thereafter, the exposed portions of layer 35 along the bottom of layer 35 are removed, such as by wet oxide etch or reactive ion etch, to leave the remaining portion of layer 35 as alignment spacers 36.

Referring back to FIG. 1, an emitter is formed as a doped region 44 on the portion of surface 12 that is exposed by spacer 36 and filler 41. Doped region 44 is also shallow and extends a short distance into region 39. In order to form region 44, the remainder of opening 24 is filled with a conductor 43 that will also be a dopant source for forming region 44. Conductor 43 generally is doped with the opposite doping type than that of region 39. In the preferred embodiment, conductor 43 is polysilicon that is doped with phosphorous. Using conductor 43 as a dopant source facilitates controlling the depth of region 44. In this preferred embodiment, a rapid thermal anneal is used to drive the dopant from conductor 43 which dopes region 44 to a depth that is no greater than the depth of layer 39. Note that conductor 43 forms an emitter electrode that makes electrical contact to region 44, thus, to the emitter of transistor 10. Conductor 18 and link 34 form a base electrode that provides electrical contact to the base of transistor 10 that is formed by regions 38 and 39. As can be seen, the width of spacers 28, 36, and fillers 41 are important and establish the dimensions of the active regions of transistor 10. The width of spacer 36 establishes the width of the active base region and also the width of the emitter of transistor 10. It can also be seen that the steps used to form the spaces are scalable and can be used to form transistors having smaller or large active regions. Additionally, the methods used to form spacers 28 and 36 and filler 41 form sidewalls that are substantially vertical or perpendicular relative to surface 12 which facilitates accurately positioning the active elements and accurately determining the spacing and dimensions of the active elements of transistor 10. The goal is to have the sidewalls perfectly vertical relative to surface 12. However, as is well known in the art there may be minor variances in process and temperature that prevent the sidewalls from being perfectly vertical relative to surface 12. It is well established in the art that variances of up to about fifteen (15) degrees are regarded as reasonable variances from the ideal goal of exactly vertical relative to surface 12.

In view of all of the above, it is evident that a novel device and method is disclosed. Included, among other features, is forming a recess underlying a conductor and filling the recess with conductor material to electrically contact the base region of the transistor. Using two different conductors facilitates forming alignment spacers that have substantially vertical sidewalls such that the sidewalls are substantially perpendicular to the surface of the substrate. The improved sidewalls of the alignment spacers improves the alignment between the active regions, facilitates forming smaller active regions, and allows the method and device to be scaled to both larger and smaller dimensions.

While the subject matter of the invention is described with specific preferred embodiments, it is evident that many alternatives and variations will be apparent to those skilled in the semiconductor arts For example, Spacers 28 are optional and may be omitted in some embodiments. Additionally, fillers 41 can be any number of materials, conducting or non-conducting, region 44 can be implanted or diffused, regions 38 and 39 may be one implanted layer, and link 34 may be other conductive material. Further, fillers 41 may be removed after defining the emitter opening or fillers 41 may be omitted and the emitter region of surface 12 may be defined by a photolithographic process. Although the method of forming regions 44 and 39 are illustrated as forming the respective emitter and base of transistor 10, for other transistor structures the functions and doping profiles of each region may change dependent upon device requirements. Also, portions of transistor 10 may be formed on top of the field oxide layer. More specifically the subject matter of the invention has been described for a particular NPN transistor structure, although the method is directly applicable to PNP bipolar transistors, diodes, as well as to MOS, BiCMOS, metal semiconductor FETs (MESFETs), HFETs, and other transistor structures. Those of average skill in the art will appreciate that the illustrated steps are exemplary only and constitute only a portion of the manufacturing process steps required to form transistor 10 on semiconductor substrate 11.

The invention claimed is:

1. A contact structure for a transistor comprising:
a semiconductor substrate having a first surface;
a first doped region on the first surface;
a second doped region on the first surface and electrically contacting the first doped region;
a first conductor having a second surface overlying the first doped region, the first conductor having a sidewall; and
a second conductor underlying a portion of the first conductor and extending from the second surface to electrically contact the first doped region wherein the second conductor is not on the sidewall of the first conductor an alignment spacer that is substantially coplanar to the sidewall of the first conductor wherein the sidewall of the first conductor is substantially perpendicular to the first surface, wherein the alignment spacer has an opening overlying the second doped region.

2. The contact structure of claim 1 further including a third conductor overlying and electrically contacting the second doped region wherein the second conductor has substantially vertical sidewalls.

3. The contact structure of claim 2 wherein the second doped region is one of an emitter or a base of a bipolar transistor.

4. The contact structure of claim 1 further including a first protective layer on a third surface of the first conductor wherein the third surface is opposite the second surface.

5. The contact structure of claim 1 further including a protective spacer on the sidewall of the first conductor.

6. The contact structure of claim 1 further including a dielectric overlying the first conductor and a protective spacer on a sidewall of the dielectric and on the sidewall of the first conductor wherein the protective spacer is substantially perpendicular to the first surface.

7. The contact structure of claim 1 wherein the alignment spacer is between the first conductor and a third conductor.

\* \* \* \* \*